United States Patent

McDonough

[15] 3,673,551

[45] June 27, 1972

[54] INTEGRATED CIRCUIT TERMINAL AND METHOD

[72] Inventor: Cletus G. McDonough, Elmhurst, Ill.

[73] Assignee: Molex Products Company, Downers Grove, Ill.

[22] Filed: Nov. 28, 1969

[21] Appl. No.: 880,574

[52] U.S. Cl. ....................339/258 R, 339/17 CF, 339/17 R, 339/191, 339/275 B

[51] Int. Cl. ....................H01r 5/04, H01r 11/22, H05k 1/12

[58] Field of Search ................339/217, 17, 256, 258, 176 R, 339/176 M, 191 M, 192 R, 176 MP, 275

[56] References Cited

UNITED STATES PATENTS

| | | | |
|---|---|---|---|
| 3,270,251 | 8/1966 | Evans | 317/101 DH |
| 2,944,240 | 7/1960 | Barber | 339/191 M X |
| 2,996,794 | 8/1961 | Burdick | 339/258 P X |
| 3,172,717 | 3/1965 | Clewes | 339/275 X |

FOREIGN PATENTS OR APPLICATIONS

| | | | |
|---|---|---|---|
| 941,891 | 11/1963 | Great Britain | 339/198.41 |

*Primary Examiner*—Marvin A. Champion
*Assistant Examiner*—Terrell P. Lewis
*Attorney*—Olson, Trexler, Wolters & Bushnell

[57] ABSTRACT

A sheet metal terminal is formed of spring metal such as brass with a plurality of terminals attached to one another in chain fashion by a carrier strip of scrap of the metal blank from which the terminals are formed. Each terminal has a mounting lug or tongue. The lugs or tongues of a plurality of interconnected terminals are inserted through aligned apertures in a pair of parallel rows in a printed circuit board, following which the terminals are flow soldered to the printed circuit board, and the scrap interconnection is cut off. A pair of rows of terminals thus is provided into which the terminals of a "crab pack" integrated circuit may be plugged.

6 Claims, 11 Drawing Figures

Inventor
Celtus G. McDonough
By: Olson, Trexler, Wolters & Bushnell attys

Inventor
Celtus G. McDonough
By: Olson, Trexler, Wolters & Bushnell attys.

INTEGRATED CIRCUIT TERMINAL AND METHOD

BACKGROUND OF THE INVENTION

Printed circuit boards are widely used in diverse electrical industries. Such printed circuit boards commonly are provided with holes through which terminal leads of electrical components are inserted, and then soldered into place. Removal of parts is difficult since localized desoldering is required, and since many components, particularly including solid state devices, are readily damaged by heat. Nevertheless, certain parts must from time-to-time be replaced. The question becomes particularly critical when integrated circuits are connected, since, as is known, a very large number of components may be provided in a single integrated circuit, and the intent is that malfunction of any one part is corrected simply by replacing the entire integrated circuit. As will be appreciated, a typical integrated circuit may have a dozen or more leads, and the problems of desoldering each terminal, particularly bearing in mind that the terminals cannot be withdrawn one-by-one, become insurmountable.

Accordingly, it is desirable to provide some sort of a plug-in terminal for receipt of the terminals of an integrated circuit. However, one of the great advantages of integrated circuits is a savings in cost of materials. If such saving is largely eliminated by the cost of added terminals, then one of the primary reasons for using integrated circuits is lost.

A more specific problem arises with certain types of printed circuit boards. In relatively high quality boards the printed circuits are located quite precisely, and the holes therein are likewise located precisely, often by drilling the holes. However, in inexpensive printed circuit boards of certain types the printed circuitry may not be precisely located. Furthermore, the holes are often not precisely located, commonly being simply stamped or punched in the board. As a consequence, a hole may not be well centered in the corresponding printed circuitry, but may be well off to one side, thereby leaving insufficient printed circuit wiring area for a proper solder connection to be made. This problem in some aspects of printed circuit boards is readily corrected simply by enlarging the dimensions of the printed circuitry. However, in the case of integrated circuits the terminals are mounted quite close together, being on the order of 0.010 inches center-to-center, and this precludes the possibility of enlarging the areas in which the holes are located.

Efforts have been made heretofore to correct this problem by staggering the holes, every other one being offset, whereby the actual spacing between each pair of holes is increased significantly, even though the linear spacing remains the same. However, this has heretofore required a special order integrated circuit which has often not been available, and which has been considerably more expensive than a standard integrated circuit, even when it is available.

SUMMARY AND OBJECTS

The foregoing problems are solved through the provision of a sheet metal terminal made of resilient metal such as brass. The terminal has a tongue or the like which can be inserted through a hole in a printed circuit board and soldered in place. A plurality of such terminals is provided in two parallel lines, whereby a "crab pack" integrated circuit can be plugged directly into the terminals. The terminals are made in chain fashion whereby a plurality of terminals is interconnected by a scrap piece of the blank metal, whereby a plurality of terminals is readily inserted in a printed circuit board in a single operation. The terminals thereupon are soldered in place, and the interconnecting scrap is severed from the terminals. In one particular form of the terminals the tongues of successive terminals are alternately offset, whereby to plug into offset holes in the printed circuit board, yet leaving the terminals aligned in a straight line for receipt of the integrated circuit terminals. A very high percentage of the initial metal blank is used, whereby the amount of scrap is quite small and efficient use is made of the initial material, thereby maintaining a low cost.

In view of the foregoing, it is an object of the present invention to provide an inexpensive terminal for soldering in place in a printed circuit board for detachable receipt of a complementary terminal of an integrated circuit.

More particularly, it is an object of the present invention to provide a plurality of such terminals interconnected by a scrape piece whereby such plurality of terminals can be simultaneously assembled with a printed circuit board.

In a specific form of the invention it is an object to provide a plurality of similar terminals with mounting tongues alternately offset in opposite directions for receipt in offset holes in a printed circuit board, but with the integrated circuit terminal receiving portions thereof in straight line array.

THE DRAWINGS

Other and further objects and advantages of the present invention will be understood with reference to the following specification when taken in connection with the accompanying drawings wherein.

THE SPECIFICATION

Figures 1, 2, 3, 4, 5, 6:
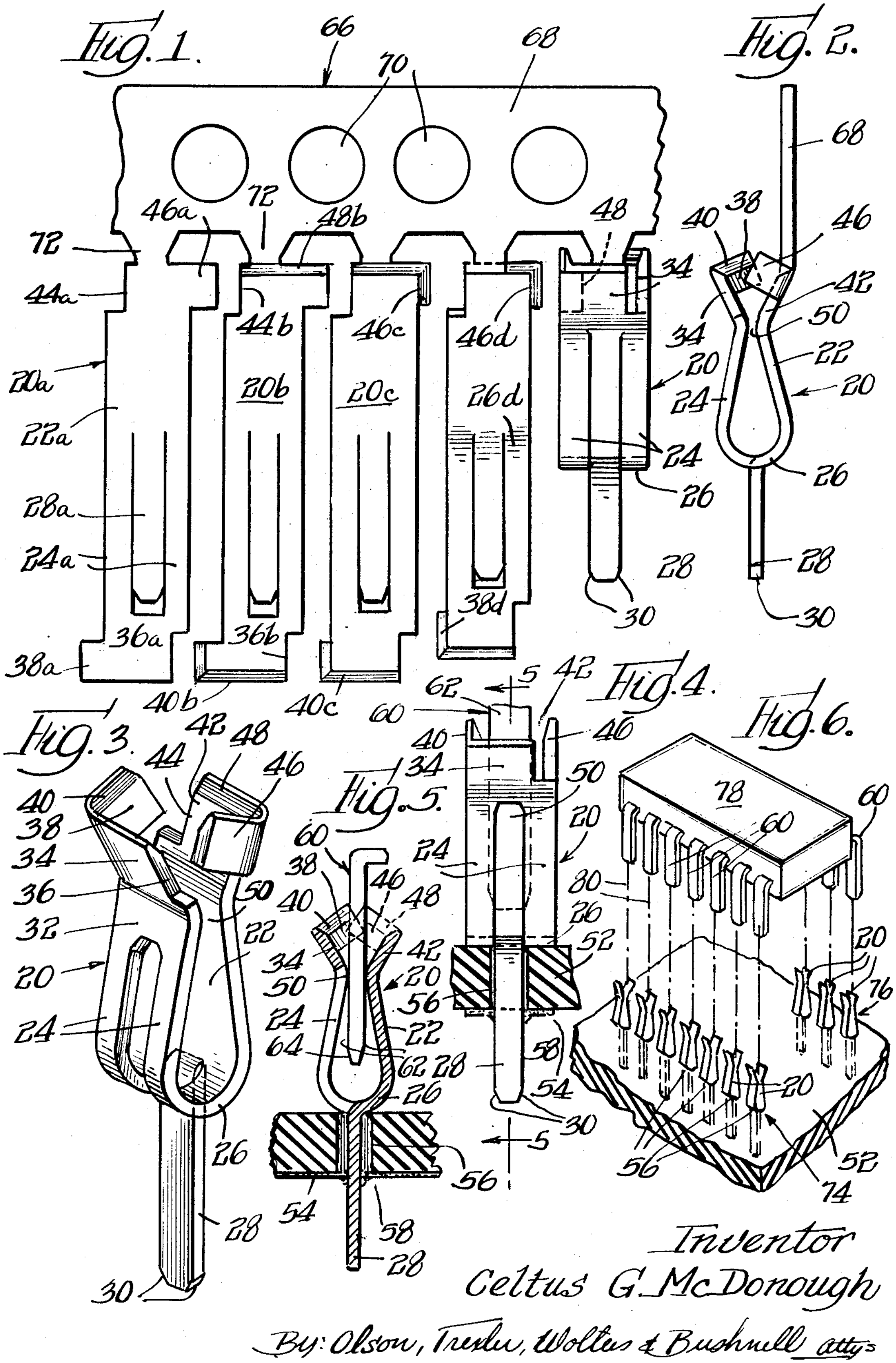
FIG. 1 is a plan view showing the successive steps in the formation of an integrated circuit terminal in accordance with the present invention.
FIG. 2 is a side view taken from the right end of FIG. 1.
FIG. 3 is a perspective view of an integrated circuit terminal in accordance with the present invention.
FIG. 4 is a front view of the terminal as installed in a printed circuit board with a terminal of an integrated circuit plugged thereinto.
FIG. 5 is a cross-sectional view taken substantially along the line 5—5 in FIG. 4.
FIG. 6 is a fragmentary exploded perspective view showing a plurality of integrated circuit terminals mounted in a printed circuit board with a "crab pack" integrated circuit about to be plugged thereinto.

Attention should first be directed to the right end of FIG. 1 and also FIGS. 2 and 3 for an understanding of one form of the terminal of the present invention. The terminal 20 is made of a suitable resilient sheet metal such as brass, phosphor bronze, or beryllium copper, and include a main body 22, and a pair of spaced apart legs 24 converging therewith, the legs being joined to the body by a bight 26. The body 22 is straight throughout most of its length, as are the legs 24, the bight 26 being a continuous arc joining the legs to the body. A tongue 28, formed by striking from the material between the legs 24, extends straight down from the bight, and has the lower corners 30 thereof chamfered to aid in placing the tongue through a hole in the printed circuit board, as will be brought out hereinafter.

The upper ends of the legs 24 are joined together as may be seen at 32, and from this point there extends an outwardly and upwardly directed flange 34 notched at one side as indicated at 36, and having a right angularly disposed lateral flange 38 along the opposite longitudinal edge. The upper extremity of the flange 34 and the corresponding upper extremity of the flange 38 are both internally chamfered at 40.

Similarly, at the upper end of the body 26 there is a diagonally outwardly disposed flange 42 notched at one longitudinal edge as indicated at 44, and having a right angularly disposed lateral flange 46 on the opposite longitudinal edge. The upper edges of the flange 42 and of the right angle flange 46 are internally chamfered at 48.

As will be seen particularly in FIG. 2, the convergence of the body 22 and of the legs 24 produces a relatively narrow throat 50 at the upper ends thereof immediately below the subsequent divergence of the flanges 34 and 42. Also in FIG. 2 it will be observed that the two flanges 38 and 46 at least partially overlap one another, and as will be seen with reference to FIGS. 1 and 3, these flanges lie in planes which are substantially parallel to one another.

Turning now to FIGS. 4 and 5, there will be seen a printed circuit board 52 of known construction including an insulating sheet or card having printed circuit wiring 54 on one face thereof, herein shown as the bottom face. The printed circuit board is provided with a hole 56 extending through the printed circuit board and also through a portion of the printed circuit wiring 54. The tongue 58 of the terminal 20 is readily inserted through the hole in the printed circuit board, particularly by virtue of the chamfered lower corners 30 of the tongue. Solder 58 then is applied to the under face of the printed circuit board by the usual flow or wave soldering technique, whereby to solder the tongue 28 to the printed circuit wiring.

A male terminal 60 of an integrated circuit then can be plugged longitudinally into the terminal 20, which will be recognized as a female terminal. The male terminal 60 is of the blade or spade type having opposed flat faces 62 engageable with the confronting surfaces of the throat 50 of the terminal 20. As will be seen, the lower end of the integrated circuit terminal 60 has champfered corners 64 to facilitate insertion in the female terminal 20.

Insertion also is facilitated by virtue of the divergence of the flanges 34 and 42, and by the champfered upper edges 40 and 48 of the flanges 34, 38 and 42, 46. The terminal 60 is gripped by the surfaces of the terminal 20 adjacent the throat 50, and the terminal 60 further is positioned from side to side of the terminal 20 by the flanges 38 and 46. The distance between the flanges 38 and 46 is substantially greater than the corresponding transverse dimension of the male terminal 60, as will be seen particularly in FIG. 4, and this facilitates insertion of the male terminal in the female terminal.

Steps in the manufacture of the terminal may be visualized with a return in FIG. 1, wherein the sheet metal blank is indicated by the numeral 66. An edge of the sheet metal blank remains as a strip or ribbon 68 interconnecting the succession of terminals 20 in their incipient and final stages. The strip 68 is provided with spaced apertures 70 for driving of the material in automatic machinery.

Some of the earliest stages of blanking are omitted from the left side of FIG. 1 as not being of critical consequence relative to the final product. At the first stage on the extreme left side of FIG. 1 what will eventually be a terminal is indicated by the numeral 20*a*, and by this time the final outline of the terminal has taken shape and the sides and end of the tongue 28 have been severed from the remainder of the material. At this stage, however, the entire terminal is still planar. At the left side of FIG. 1, the subparts of prospective terminal 20*a* are identified by the numerals heretofore used with the addition of the suffix *a*, and the prospective terminal is still connected to the next prospective terminal on the left at the lower corner adjacent the prospective flange 38*a*. The reason for the notches 36 and 44 will be seen in connection with the corresponding areas 36*a* and 44*a* in providing clearance for severing from the adjacent flange portions 38*a* and 46*a* while positioning the tongues on 0.010 centers. This spacing is further maintained by placing the flanges 38*a* and 46*a* on opposite ends of the blanked terminal. The terminal blanks are connected to the carrier strip 68 by generally trapezoidal scrap pieces 72.

Moving to the next adjacent prospective terminal 20*b*, the situation is generally the same as described in connection with 20*a*, except that the chamfered edges 40*b* and 48*b* have now been provided.

Moving to the next area to the right, where the prospective terminal is identified at 20*c*, it will be seen that the flanges 40*c* and 46*c* have been turned out of the initial plane. Continuing to the next area to the right, wherein the prospective terminal is identified as 20*d*, it will be seen that the material has been impressed at a central area 26*d* corresponding to the ultimate bight, thereby somewhat foreshortening the length of the blanked material.

The next step to the right results in the final terminal 20, and as will be understood all steps are carried on in succession in generally conventional punched press machinery.

A plurality of finished terminals remain attached to one another in chain fashion by means of the carrier strip 68 and the scrap sections or tabs 72. Such plurality of terminals is handled as a unit, and the tongues thereof are inserted through a plurality of aligned holes 56 in the printed circuit board 52 (see FIG. 6), and all of the terminals are soldered in place as heretofore indicated. Subsequent to the soldering operation, all of the tabs are severed from the terminals in a shearing operation, whereby to leave the separate terminals 20 mounted on the printed circuit board in two parallel rows 74 and 76. Thus, the so called "crab pack" integrated circuit unit or module 78, having a plurality of terminals 60 on either side thereof is readily plugged into the terminals 20, as indicated by the broken lines 80 in FIG. 6. The integrated circuit module is thereafter readily removed from the printed circuit board 52 by simply lifting up on it to remove the male terminals 60 from the female terminals 20, whereupon the integrated circuit module or a duplicate thereof may subsequently be reinstalled in the same manner as the original installation. As will be understood, such removal and reinstallation would be done in the event of failure of any part of the integrated circuit, or upon development of updated integrated circuits, or upon servicing of the printed circuit board or associated parts which might require heating thereof.

A modification of the invention is shown in FIGS. 7–11 for use with offset holes in a printed circuit board, the mounting tongues 128 being offset for this purpose. Certain of the parts in these figures are structurally or functionally similar to those heretofore shown and described, and for purposes of correlation and to avoid prolixity of numbers, similar numerals are used with the prefix 1. Attention should be directed first to FIGS. 8–10 for an understanding of the present form of the female terminal 120. The body 122 in the present instance comprises flat upper and lower sections with a tongue 222 extending down and in from the top section and spaced from the bottom section. The mounting tongue 128 is integral with the body 122 at the upper and lower sections thereof and is turned out at 90° therefrom. A sidewall 204 joins the body 122 at right angles thereto, having a vertically elongated section removed at 206 to facilitate bending of the sheet metal from the blank to form the right angle corners 208 and 210 between the body 122 and the sidewall 204.

The sidewall 204 is integrally joined at right angles by a rear wall 212 having an opening at 214 of the same vertical extent as the opening 206, whereby to facilitate formation of the right angle corners between the sidewall 204 and the rear wall 212. Similarly, there is a second sidewall 216 integral with the rear wall 212 at right angles thereto and parallel to the sidewall 204. The opening 214 facilitates forming the right angle corners between the rear wall 212 and the side wall 216. The side wall 216 terminates in a free edge 220 spaced from the body 122 to form a substantially closed, box-like structure. The entire upper periphery 218 is tipped out to facilitate reception of a male terminal.

The rear side 212 of the terminal is provided with a contact strip or tongue 222 extending downward and in from the upper portion of the rear wall 212 at 224, and then extending again back out obliquely at 226 to a free end 228 spaced from the lower portion of the rear wall 212. The tongue 222 is substantially a mirror image of the tongue 202.

Figures 7, 8, 9, 10, 11:
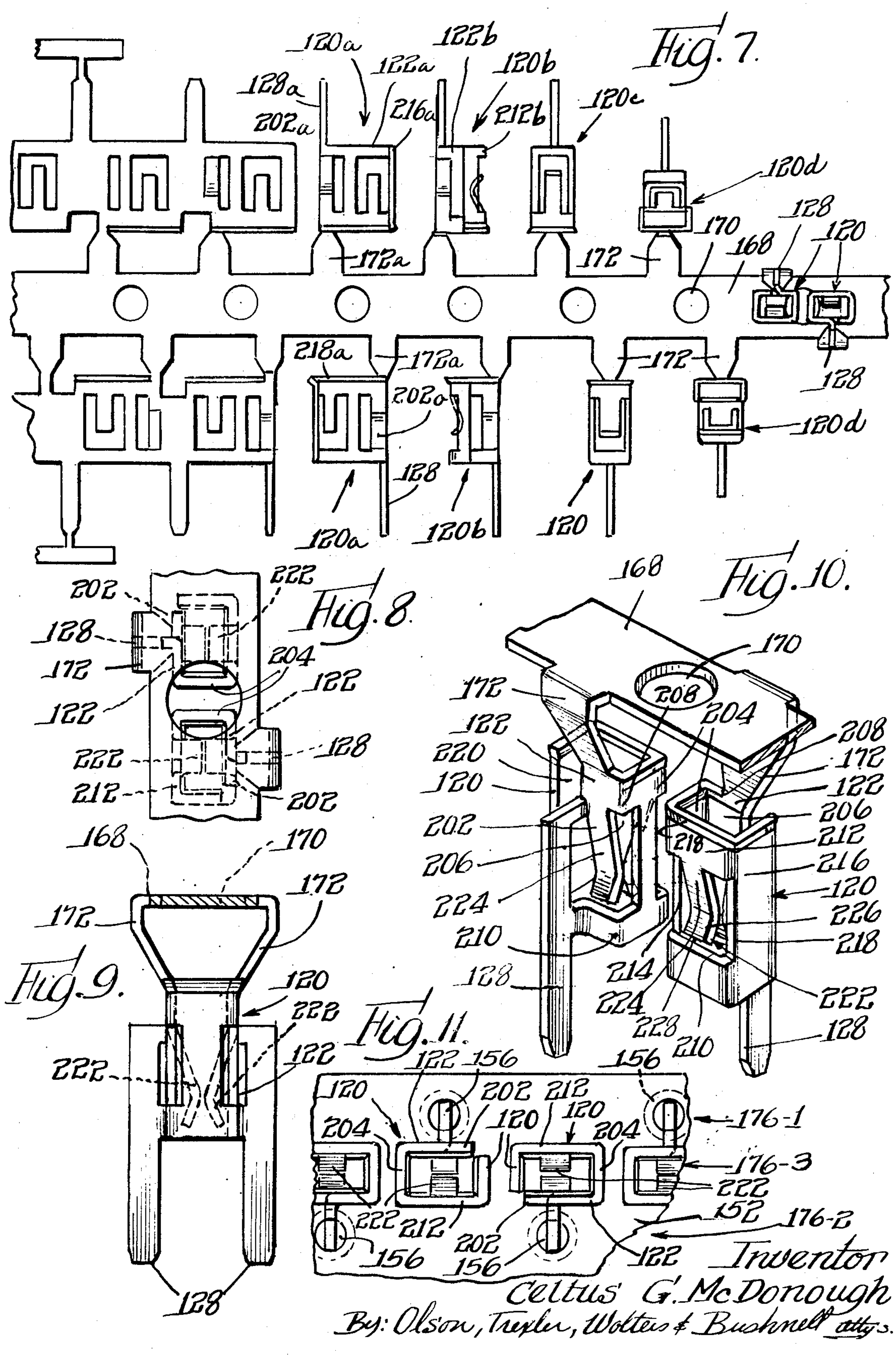
FIG. 7 is a view generally similar to FIG. 1 showing a modification of the invention for use with offset printed circuit board holes.
FIG. 8 is a fragmentary top view of a pair of terminals and interconnecting scrap piece in accordance with the embodiment of FIG. 7.
FIG. 9 is an end view of the interconnected terminals as taken from the lower end of FIG. 8.
FIG. 10 is a perspective view of a pair of terminals in accordance with FIGS. 7–9.
FIG. 11 is a plan view of a fragment of a printed circuit board showing the terminals of FIGS. 7–10 plugged thereinto, the terminals being shown in cross-section.

As will be seen with continued attention to FIGS. 8–10, the scrap or carrier strip or band 168 lies in a horizontal plane with the connecting scrap tabs 172 extending down and diagonally in toward the centerline of the strip 168 whereby all of the terminals 120 lie in a straight line. However, since the terminals are alternatively reversed, the mounting tongues 128 are not aligned, but are spaced apart in two lines. Hence, with reference to FIG. 11, it will be seen that one "row" of holes 156 in a printed circuit board actually comprises two rows 176-1 and 176-2. When the terminals 120 held together by the carrier strip 168 have their alternately opposite tongues 128 inserted in the holes 156 of the rows 176-1 and 176-2 the bodies of the terminals 120 are aligned in one single row 176-3 intermediate the rows 176-1 and 176-2, whereby the bodies of the terminals may receive the male terminals of an integrated circuit of the "crab pack" variety as discussed heretofore.

As will be appreciated, the assembly of the groups of terminals with the printed circuit board 152 is the same as with the prior form of the invention, the terminals being supported by the carrier strip until they have been assembled with the printed circuit board by having their tongues 128 inserted through the holes and soldered to the printed circuit wiring on the printed circuit board.

Various steps in the formation of the terminals in automatic punch-press machinery are shown in FIG. 7, and initial blanking steps need not particularly be described. Reference should be had to about one third of the way from left to right of FIG. 7 where the final blank is formed, being indicated at **120*a*. At this point the tongue 128*a* has already been turned at right angles, and the second sidewall 216*a* has already been turned at right angles to the blank. Likewise, the contacting tongues 222*a* and 202*a* have been deformed from the plane of the blank. As will be apparent, two relatively reversed perspective terminals 120*a* are opposite one another, being attached to the carrier strip 168 by offset tabs 172*a***.

At the next station, the terminals **120*b* have further been formed, with the rear wall 212*b* having been turned at right angles to the plane of the body 122*b***.

The final turning at right angles has been effected at **120*c*, except that the body remains in the plane of the carrier strip 168. At 120*d* the terminal has been bent at an angle to the tab 172**, and then in the final stage shown at the right the tab has been bent at an angle to the carrier strip whereby the terminal depends at right angles below the carrier strip.

The terminals have been described as mounted in straight lines as required by "crab pack" integrated circuits. Other types of integrated circuits have terminals in other patterns such as circular, etc., and it will be understood that such arrays of female terminals are contemplated by the present invention.

The invention is claimed as follows.

I claim:

1. A female terminal for detachable receipt of a male terminal such as a solid state device comprising a metal construction and having walls shaped to define a generally tubular body, said body having resilient means therein defining a space into which a male terminal may be mounted such that the male terminal projects outwardly from one end of the body, a mounting member lying in laterally offset but generally parallel relation to the longitudinal extent of said body and extending beyond the other end of said body, and means forming an integral connection of body metal between the mounting member and said body, said integral connection including spaced bridges of body metal with one of said spaced bridges being intermediate said ends and another bridge being at said other end.

2. A female terminal comprising a body of resilient metal construction, said body having a rear wall defined by wall portions at the opposite ends of the body, a front wall in spaced parallel relation to said rear wall and defined by wall portions at the opposite ends of the body, a first cantilevered blade extending from one of said rear wall portions toward the other rear wall portion, a second cantilevered blade extending from one of said front wall portions toward the other front wall portion, said blades converging to form a restricted passageway adjacent to one end of said body for detachably receiving a male terminal therebetween, a first side wall marginally joining said front and rear walls and being substantially at right angles to each, a second side wall opposite to said first side wall and marginally joined to said front and rear wall and being substantially at right angles to each, said second side wall terminating in a free edge that is adjacent to an edge of said front wall and with said last two mentioned edges being substantially at a corner of said body, and a mounting tongue integral with said portions of said front wall and being laterally offset from said body, said mounting tongue being generally parallel to the longitudinal extent of said body, said mounting tongue being joined to each of said last-mentioned wall portions by respective spaced bridges of body material.

3. A female terminal assembly comprising a plurality of tubular metal bodies, each body having resilient means therein defining a space into which a male terminal may be mounted such that the male terminal projects outwardly from one end of the body, a mounting member associated with each body and lying laterally offset but generally parallel to the longitudinal extent of the body and extending beyond the other end of the body, means forming an integral connection of body metal between each body and its associated mounting member, and a metallic carrier strip joining said bodies such that the bodies are parallel and in a line and the mounting members of adjacent bodies are on opposite sides of the line to form two rows of mounting members.

4. A female terminal assembly according to claim 3 in which the carrier strip is joined to each body by a tab that projects from one edge of the body.

5. A female terminal assembly according to claim 4 in which said tabs are joined to an edge of the carrier strip and extend therefrom diagonally toward the centerline of the strip.

6. A female terminal assembly according to claim 4 in which said means forming the integral connection of body metal comprises spaced bridges of body material.

* * * * *